United States Patent [19]

Brust

[11] Patent Number: 4,820,977
[45] Date of Patent: Apr. 11, 1989

[54] METHOD AND APPARATUS FOR IDENTIFYING POINTS ON A SPECIMEN HAVING A DEFINED TIME-DEPENDENT SIGNAL

[75] Inventor: Hans D. Brust, Dudweiler, Fed. Rep. of Germany

[73] Assignee: Siemens Aktiengesellschaft, Berlin and Munich, Fed. Rep. of Germany

[21] Appl. No.: 941,646

[22] Filed: Dec. 15, 1986

[30] Foreign Application Priority Data

Dec. 17, 1985 [DE] Fed. Rep. of Germany ....... 3544600

[51] Int. Cl.⁴ .................... G01N 23/00; G01R 31/26
[52] U.S. Cl. .......................... 324/158 R; 324/158 D; 250/310; 250/311
[58] Field of Search ............ 324/73 R, 158 R, 158 D; 250/307, 397, 310, 311, 492.2

[56] References Cited

U.S. PATENT DOCUMENTS

| | | | |
|---|---|---|---|
| 4,220,853 | 9/1980 | Feuerbaum et al. | 324/158 D X |
| 4,223,220 | 9/1980 | Feuerbaum | 324/158 D X |
| 4,277,679 | 7/1981 | Feuerbaum | 324/158 D |
| 4,286,154 | 8/1981 | Okubo et al. | 250/310 X |
| 4,292,519 | 9/1981 | Feuerbaum | 250/310 X |
| 4,413,181 | 11/1983 | Feuerbaum | 324/158 D X |
| 4,486,660 | 12/1984 | Feuerbaum | 324/158 R X |
| 4,581,534 | 4/1986 | Todokoro et al. | 250/310 X |
| 4,581,578 | 4/1986 | Honma et al. | 324/158 D X |
| 4,605,860 | 8/1986 | Fukuhara et al. | 250/397 X |
| 4,675,602 | 6/1987 | Feuerbaum et al. | 250/311 X |
| 4,686,466 | 8/1987 | Feuerbaum et al. | 250/310 X |
| 4,689,555 | 8/1987 | Brust et al. | 324/158 R |
| 4,745,362 | 5/1988 | Brust | 324/158 D X |

FOREIGN PATENT DOCUMENTS 3428965 2/1986 Fed. Rep. of Germany.

OTHER PUBLICATIONS

Goldstein et al., "Practical Scanning Electron Microscopy", Plenum Pren, New York, 1975, pp. 95-99 and 110-116.
Brust et al., "Frequency Tracing and Mapping: Novel Electron . . .", Proc. of Microcircuit Eng. Conf., Berlin, (9/1984), pp. 411-425.

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

A method for function checking microelectronic components inside LSI circuits, particularly during the development phase, provides localization and imaging of regions of a specimen which carry defined signals that depend on the operating status of the cirucit. For localizing the points carrying the defined electrical signals, a primary beam reads the signal at the measuring point and a secondary signal derived therefrom is compared in a detector arrangement to the anticipated or sought-after signal by a correlation method. For the correlation, the intensity of the primary beam or the current of the secondary particles are modulated alternately with the sought-after or anticipated signal and, respectively, with the negation of the sought-after or anticipated signal and the measured secondary signal is integrated. Part of the integrated secondary signal changes with the frequency prescribed by the signal change, which is filtered out and supplied to an evaluator circuit which controls the intensity of a display, such as a picture screen.

30 Claims, 4 Drawing Sheets

METHOD AND APPARATUS FOR IDENTIFYING POINTS ON A SPECIMEN HAVING A DEFINED TIME-DEPENDENT SIGNAL

BACKGROUND OF THE INVENTION

1. Field of the Invention

The present invention relates generally to a method for localizing and imaging portions of a specimen having a defined time-dependent signal using a scanning microscope focused thereon and to an apparatus for implementing the present method.

2. Description of the Prior Art

Large scale integrated circuits can be function checked using a computer controlled test system. The test system identifies existing errors by analyzing the voltage levels at the outputs of the circuit depending on the bit patterns supplied to the circuit. Using such a method localizing of errors is done only with great difficulty. As such, additional measurements for the inside portions of large scale integrated circuits must be carried out, particularly during the development phase of the circuit's manufacture. Electron beam measuring methods have proven particularly suitable for such tests in all areas of development and manufacture of microelectronic components. The dynamic distribution of potential in the integrated circuits is imaged in methods known as "voltage coding", or "logic-state mapping", for example. Also, temporal curves of voltage at individual nodes on the circuit are defined in a method identified as "waveform measurement".

As disclosed in the publication H.-D. Brust "Frequency Tracing and Mapping: Novel Electron Beam Testing Methods" (Proceedings of the Microcircuit Engineering Conference, Berlin, September 1984, pp. 412–425), a method for localizing and imaging the interconnections of an integrated circuit carrying a specific frequency is known. However, it is not possible with the disclosed method to distinguish between signals of the same freqency but having different signal curves.

Therefore, it is proposed to provide a method whereby interconnections of an IC carrying a defined electrical signal are localized and imaged, as disclosed in German Patent Application No. P 34 28 965. The disclosed method is referred to as "logic-state tracing" (LST). Not only are the interconnections carrying the sought-after signal displayed brightly on a visual display means, but also, under certain conditions, regions of the specimen under test in which particularly high or low secondary electron currents occur are also displayed brightly. Such high or low secondary electron currents can occur due to material or topographical contrasts of the specimen under test.

U.S. Pat. Nos. 4,220,853 and 4,223, 220 disclose electron beam measuring instruments.

SUMMARY OF THE PRESENT INVENTION

An object of the present invention is to provide a method and arrangement for checking whether an anticipated signal is produced at a point of a specimen under test by periodic sequencing. For faulty specimens, the present method can identify whether a defined signal occurs at all. The present method and apparatus largely suppress the disturbing influences of material and topography contrast to facilitate such identification. This and other objects of the present invention are obtained by suppressing the disturbing influence of the material and topography contrast so that only those regions of the specimen carrying the sought-after signal are imaged. For example, such regions may be interconnections of an integrated circuit.

DESCRIPTION OF THE PREFERRED EMBODIMENTS

Figure 1:
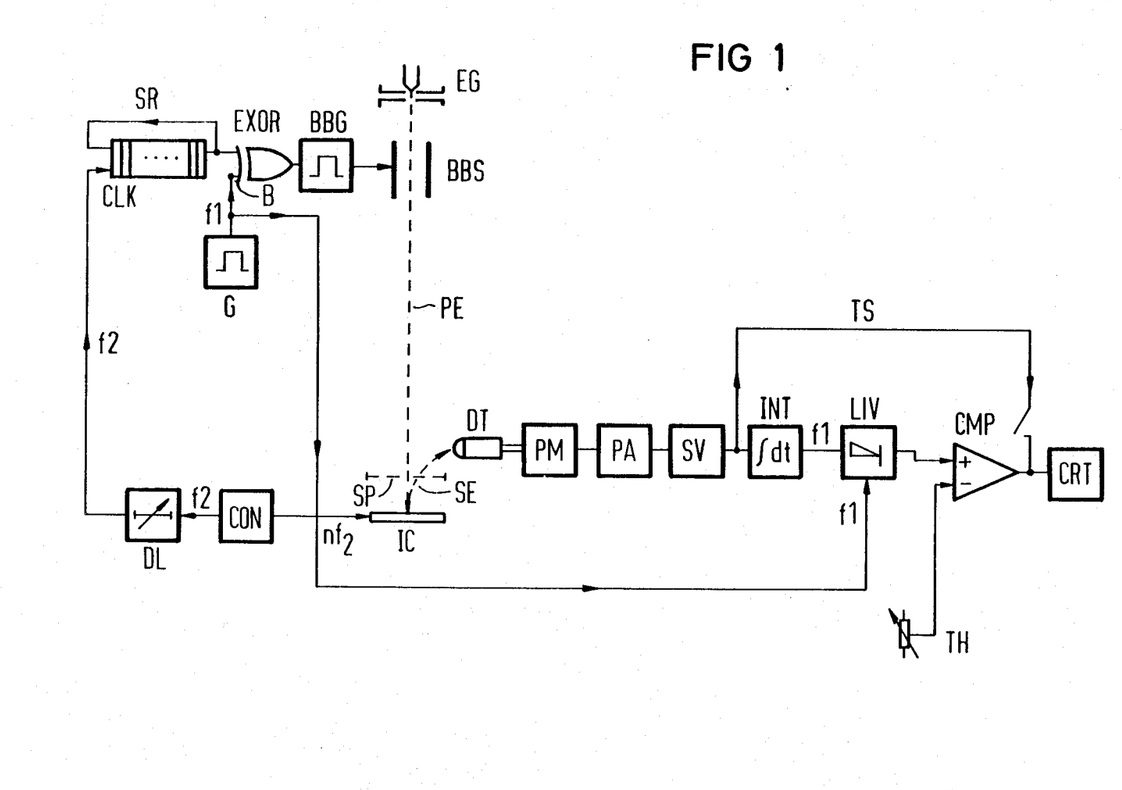
FIG. 1 is a schematic representation of an arrangement for implementing the method of the present invention.

An arrangement is shown in FIG. 1 for implementing the method of the present invention, including a finely focused primary electron beam PE generated in an electron-optical column of an electron beam measuring instrument.

In addition to a plurality of diaphragms and magnetic lens systems provided for beam shaping, beam deflection, and beam focusing (not shown), the electron-optical column includes an electron gun EG formed essentially of a cathode, an anode, and a Wehnelt electrode. A beam blanking system BBS is driven by a beam blanking generator BBG. A detector DT is formed of an extraction grid and a scintillator, for example, and is provided for registering secondary electrons SE triggered at a selected point of incidence of the primary electron beam PE on a specimen IC.

The secondary electron current received by the detector DT fluctuates in intensity as a consequence of different contrasts of voltage, material, and topography at the individual measuring points of the specimen IC. The fluctuating secondary electron current generates light pulses in the scintillator which are supplied through an optical conductor to a photomultiplier PM, where they are converted into a secondary electrical signal. Subsequently, the secondary electrical signal is amplified in a preamplifier PA and then supplied to a circuit SV which improves the signal-to-noise ratio of the electrical signal. The circuit SV is, for example, a low-pass filter to smooth the signal. An integrator INT is connected at an output of the circuit SV for integrating the signal over a defined time interval. In one embodiment, the detector DT is preceded by a spectrometer SP, which is preferably a retarding field spectrometer. The spectrometer SP measures the shift of the energy distribution of the secondary electrons SE depending on the voltage at the specimen IC. In FIG. 1, the spectrometer SP is schematically illustrated by a planar retarding field electrode.

(*) Such a spectrometer is disclosed in U.S. Pat. No. 4,292,579.

The specimen IC is preferably an integrated circuit operating at nominal frequency into which the test programs adapted to the problem to be investigated are periodically supplied by a controller CON. The circuit structure of the specimen IC causes characteristic signals defining the operating status of the specimen IC to appear at nodes and interconnections during the test cycle. The characteristic signals are capable of comparison to, for example signal curves generated by simulation calculations for the purpose of checking the functions of the specimen IC.

The specimen integrated circuit IC can, of course, be replaced by any specimen which includes interconnections or contact points carrying electrical signals at locations accessible by the primary electron beam PE.

The method of the present invention enables the interconnections of an integrated circuit IC which carry a defined sought-after, or anticipated, signal to be localized and imaged. The sought-after signal may be either a digital or a binary signal. The exemplary embodiment set forth below is specifically directed to binary signals however, and, as such, the sought-after signal of the disclosed embodiment is in the form of a defined bit pattern.

As disclosed in a method set forth in the German Patent Application No. P 34 28 965, a signal measured at a selected measuring point of an IC is compared to a sought-after bit pattern with the assistance of a correlation method. As a consequence of a low bandwidth detector arrangement, the correlation is carried out by the primary electron beam PE through the mechanism of voltage contrast given high frequency signals, such as clock frequencies of $>5$ MHz.

When the signal at a point on the specimen IC is referenced f(t) and the sought-after bit pattern is referenced g(t), then the correlation of equation (1) must be carried out.

$$c := \int f(t) \cdot g(t) \cdot dt \quad (1).$$

Since the secondary electron current $i_{SE}$ is proportional to the primary electron current $i_{PE}$ and is also dependent on the signal f(t) at the measuring point, then $$i_{SE} = h(f(t)) \cdot i_{PE} \quad (2)$$

is true where h(f(t)) identifies the influence of the characteristic of voltage contrast on the secondary electron current $i_{SE}$.

When the primary electron current $i_{PE}$ is modulated in amplitude or intensity with the sought-after signal g(t), such as by gating and blanking the primary electron PE in accordance with the chronlogical presence of high and low values of the sought-after bit pattern g(t) and when the secondary electron current $i_{SE}$ as measured by the detector DT is integrated simultaneously, then the correlation set forth in equation (1) is executed. The nonlinearity of the voltage contrast is not a problem since only the binary signals g(t) and f(t) are present.

When the sought-after bit pattern g(t) and the signal f(t) of the measuring point agree in the sequence of their high and low values and in terms of phase within a selected integration time span, then the value of the integral is the maximum of $$c_{max} = \int f(t) \cdot g(t) \cdot dt \text{ in case } g(t) = f(t) \quad (3).$$

When, by contrast, the sought-after bit pattern g(t) is the negation of the signal f(t), then the value of the integral is at a minimum as set forth in $$c_{min} = \int f(t) \cdot g(t) \cdot dt \text{ in case } g(t) = \text{Neg}(f(t)) \quad (4).$$

For all other signals f(t), the integral moves between the limits $c_{max}$ and $c_{min}$. This is also the case when the measuring point carries a sought-after bit pattern but the bit pattern is phase-shifted, or occurs with a time-delay.

To suppress the material or topographical contrast which has an undesired influence on the measurements, the primary electron beam PE is alternately modulated with the sought-after bit pattern g(t) and with the negation of the sought-after bit pattern g(t). In other words, the primary electron beam is gated and blanked with the assistance of the beam blanking system BBS depending on the high and low values appearing in the bit sequence. The sought-after bit pattern g(t) is read into a shift register SR for the beginning of the measurement. The content of the shift register SR is cyclically shifted during the measurement at the frequency $f_2$ as prescribed by an external clock signal CLK. The clock signal CLK can be generated by frequency dividing a clock signal frequency $nf_2$ generated by the controller CON. For modulating the primary electron beam PE, the output signal of the shift register SR corresponding to the sought-after bit pattern g(t) is supplied to a beam blanking generator BBG which controls the beam blanking system BBS. First, however, the signal from the shift register SR is transmitted through an exclusive OR gate EXOR which is selectively operating in a negating and a non-negating operating mode. The drive of the beam blanking system BBS ensues directly from the amplified output signal of the exclusive OR gate EXOR.

For switching the exclusive OR gate EXOR from the non-negating to the negating operating mode, an input B thereof is connected to an output of a signal generator G. The signal generator G is switched at a switching frequency $f_1$ which is smaller than the repetition rate of the sought-after bit pattern g(t) at a measuring point.

When, for example, the primary electron beam PE is positioned on an interconnection carrying the sought-after bit pattern g(t), the the integrator INT supplies an output signal that has an amplitude changing between the extreme values $c_{min}$ and $c_{max}$ as defined in equations (3) and (4). The output signal of the integrator INT changes with a switching frequency $f_1$. The amplitude of the fluctuations is described by the equation $$\Delta c_{max} - c_{min} \quad (5)$$

so that the amplitude is always at a maximum when the interconnect being tested carries the sought-after bit pattern g(t).

When the sought-after bit pattern g(t) is not present at the interconnection being tested, or when the bit pattern g(t) appears with a time delay or phase-shift, then the amplitude of the fluctuations generated at the output of the integrator INT is smaller than the quantity $\Delta c$ as defined in equation (5). This is particularly true for those regions of the specimen IC at which an especially great or small number of secondary electrons SE are emitted and registered in the detector DT due to the specific materials, such as oxide layers, or due to the topography, such as edges. The secondary electron signal registered at those regions and integrated in the integrator INT remains nearly constant largely independent of the negated and non-negated bit pattern modulating the primary electron beam. Thus, the fluctuation of the integrator output signal in such case is always smaller than $\Delta c$. So, to identify whether a point carries the sought-after signal g(t), it is sufficient to identify the fluctuation of the integrator output signal with a phase-sensitive detector, for example, and to compare this to a threshold level TH, where TH is $\lesssim \Delta c$.

As shown in FIG. 1, the integrator INT is followed by a lock-in amplifier LIV having a reference input RE connected to the output of the signal generator G. In place of the phase-sensitive detector LIV, a band-pass filter tuned to the switching frequency $f_1$ and having an amplitude demodulator connected at its output can also be used. The amplitude demodulator can be a peak value rectifier. A comparison of the fluctuating amplitude to the response threshold TH is performed in a comparator CMP having an input wired to the output signal of the lock-in amplifier LIV. The comparator CMP generates a signal only when the fluctuations of the integrator INT output signal are above the response threshold TH. This occurs only when the measuring point carries the sought-after bit pattern g(t) in phase.

Under certain conditions, an integrator INT can be entirely eliminated as an independent component since the detector DT itself acts as an integrator for high frequencies. For a suitable selection of scan rate, the picture tube CRT of the scanning electron microscope also acts in integrating fashion at low frequencies.

To represent the interconnection of the specimen IC carrying a defined bit pattern, the surface thereof is scanned line-by-line or point-by-point with the primary electron beam PE. The scanning is done slowly enough that the above-described correlation procedure is carried out for every point of the surface within the time interval with which the expected signal can appear. The primary particle beam PE must therefore remain positioned at every measuring point at least during the integration duration. When this is not the case, the measurement can be periodically undertaken. To image the surface structure of the specimen IC carrying the sought-after bit pattern g(t) in phase, the output signal of the comparator CMP is recorded dependent on the measuring point being impinged by the primary electron beam PE. The output signal of the comparator CMP is used for modulating the intensity of the write beam of the picture tube CRT which is deflected synchronously with the primary electron beam PE for a simple registration. The write beam is deflected so that all interconnects which carry the sought-after signal g(t) are displayed brightly. For better localization of these structures within the highly complex circuit, it is advantageous to superimpose a topographic signal, such as a conventional secondary electron image of the specimen IC, on the output signal of the comparator CMP so that they are displayed simultaneously. In FIG. 1, this is represented schematically by a signal line TS.

The only thing that the invention as set forth hereinabove will check is whether a defined bit pattern f(t) appears in phase with a sought-after signal g(t) at an investigated measuring point. It is possible to adjust the phase at which the test is undertaken by the use of a time-delay element DL connected between the controller CON and the clock input CLK of the shift register SR. Since only the phase difference is of interest in such test, the time-delay element DL can instead be connected between the controller CON and the specimen IC.

Figure 2:
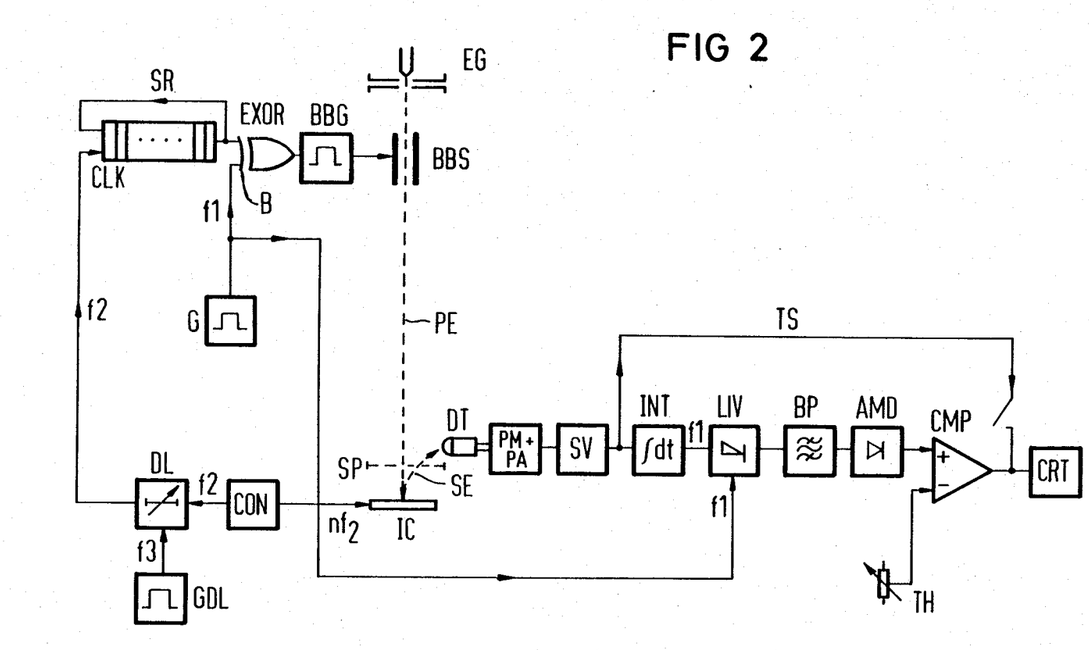
FIG. 2 is a schematic representation of a second embodiment of an arrangement for the present method.

In FIG. 2 is shown an arrangement of the present invention in which the test can be made phase-independent. In other words, the test is undertaken to see whether the anticipated bit pattern is present at all at the measuring point. An electrically controllable time-delay element DL is connected for control by a generator GDL having an output frequency $f_3$. The phase relation at which the primary electron beam PE is modulated with the sought-after bit pattern g(t) or, respectively, the negation thereof, periodically changes with the frequency $f_3$ relative the signal at the measuring point f(t). This is accomplished by periodically changing the delay time of the time-delay element DL. In addition to the signal component having the frequency $f_1$ as generated by the switching of the exclusive OR gate EXOR, the output signal of the integrator INT also includes a signal component having a frequency $f_3$, which is generally lower than the frequency $f_1$, when the measuring point carries the sought-after bit pattern g(t). The signal component having a frequency $f_1$ is filtered out by a phase-sensitive detector, such as the lock-in amplifier LIV shown in FIG. 2. The signal at the ouput of the lock-in amplifier LIV still has a frequency component $f_3$. This signal is supplied to the input of a band-pass filter BP tuned to the frequency $f_3$. The amplitude of the signal having the frequency $f_3$ is subsequently identified by the following amplitude demodulator AMD, which together with the filter BP forms a second demodulating means for the frequency $f_3$, and is compared to the variable response threshold TH in the comparator CMP. The output signal of the comparator CMP, in turn, which is dependent on the location of the measuring point on the specimen IC, is used to control the intensity of a write beam of the picture tube CRT.

It is, of course, possible to not only filter out the frequency $f_3$ with the band-pass filter BP, but also to filter out the phase-sensitivity, such as with a lock-in amplifier (not shown). In such case, the amplitude demodulator AMD becomes superfluous.

The frequency $f_1$ with which the exclusive OR gate EXOR is switched can be selected to be smaller than the frequency $f_3$ with which the time-delay element DL is driven. In this case, however, the frequency $f_3$ must first be filtered out of the secondary electron signal and then the frequency $f_1$. This is true since the frequency $f_1$ now modulates the frequency $f_3$ which acts as a carrier frequency. Such modification requires that the circuit shown in FIG. 2 have the lock-in amplifier LIV and the band-pass filter BP with the following amplitude demodulator AMD in reverse sequence in the signal chain.

In another embodiment of the present invention, the frequency $f_2$ with which the bit sequence of the sought-after bit pattern g(t) is cyclically shifted in the shift register SR is slightly offset relative to the clock frequency generated by the controller CON so that a modification of the phase relationship of the primary electron beam PE modulated with the sought-after bit pattern g(t) or the negation thereof occurs relative to the signal at the measuring point f(t). The signal at the output of the lock-in amplifier LIV then has the prescribed difference frequency and can be supplied to a band-pass filter tuned to this difference frequency.

In the arrangements illustrated in FIGS. 1 and 2, the upper limit frequency is defined by the beam blanking system BBS being used. Since beam blanking system BBS are available capable of operating in the $GH_z$ range, the present invention can be used for checking integrated circuits IC under real operating conditions.

In a further development of the invention, the primary electron beam PE is not modulated as set forth above, but instead, the secondary electron current $i_{SE}$ is alternately modulated with the sought-after bit pattern g(t) or, respectively, the negation thereof. A secondary electron spectrometer SP, such as that disclosed in U.S. Pat. No. 4,292,419, is used to modulate the secondary electron current $i_{SE}$ wherein the height of the potential barrier built-up within the spectrometer SP is controlled and, thus, the intensity of the secondary electron current $i_{SE}$ detected by the detector DT is controlled.

An arrangement for implementing such method is modified in comparison to the arrangement shown in FIGS. 1 and 2, in that an output signal of the exclusive OR gate EXOR is supplied to an input of an adder whose output is connected to a retarding field electrode of the spectrometer SP. An advantage of such arrangement is that by driving the regarding field electrode through an adder, the operating point of the spectrometer SP can be set to an optimum. Otherwise, the signal processing chain as shown in FIGS. 1 and 2 remains unmodified.

This method does not require a beam blanking system. However, the relatively high capacitance of the spectrometer SP provides a limit frequency which is lower than that for the arrangements of FIGS. 1 and 2.

The modulation of the secondary electron current $i_{SE}$ may be controlled in one embodiment by a detector DT whose extraction voltage is controlled by the sought-after bit pattern g(t). An arrangement for implementing such method includes the output signal of the exclusive OR gate EXOR being connected to an input of an adder, for example, whose output is connected to the extraction electrode of the detector DT. The signal processing chain is not otherwise modified over that shown in FIGS. 1 and 2.

Figure 3:
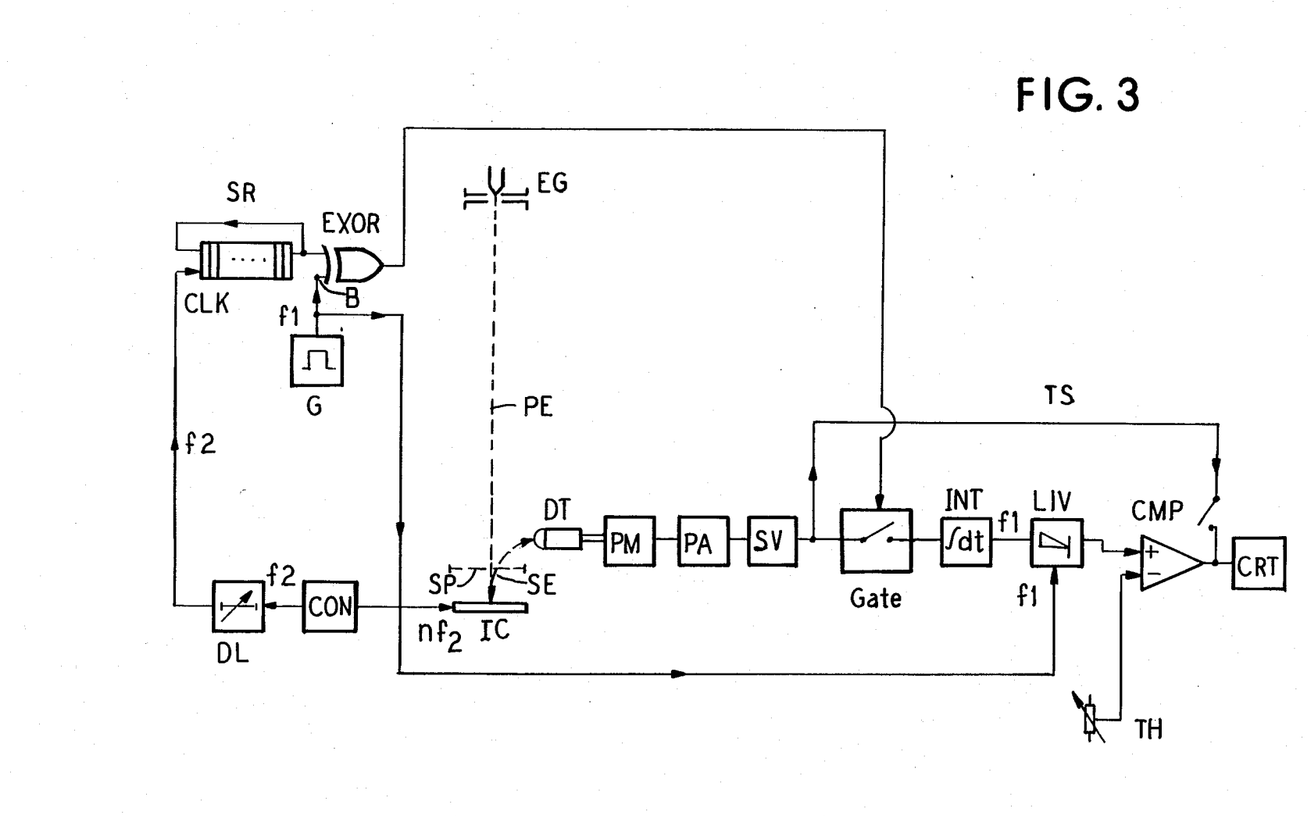
FIGS. 3 and 4 show further embodiments of the invention.

In a further development of the present invention, shown in FIG. 3 the secondary electron signal that is generated in a signal processing circuit (e.g. a scinhillator-photomutiplier arrangement) is modulated instead of the primary electron beam PE. The secondary electron signal is modulated by the sought-after bit pattern g(t) with the use of a gate circuit. Such arrangement uses all of the circuit elements shown in FIGS. 1 and 2 with the exception of a beam blanking system BBS and a siganl generator BBG. In addition, a mixer is connected between the circuit SV and the integrator INT to improve the signal-to-noise ratio. A second input of the mixer is connected to the output of the exclusive OR gate EXOR. The mixer, as used for sought-after analog signals, can be a multiplier, while for sought-after digital signals or bit patterns, the mixer can be a simple electric switch.

Figure 4:
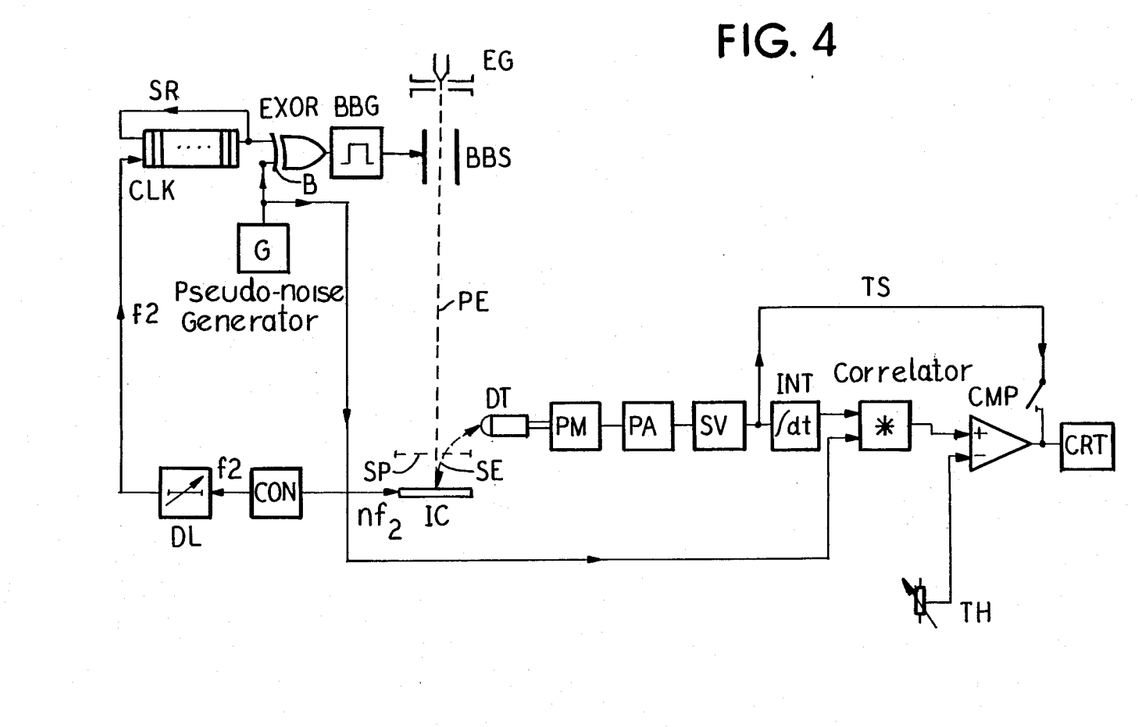

In accordance with a further development of the invention, the modulation frequency $f_1$ is omitted and either the primary or secondary electron currents or, respectively, the secondary electron signal is identified by a modulation in some other way. This identification can be used to filter the fluctuating amplitude out of the processed secondary electron signal with the assistance of a suitable filter or demodulator. For exammple, an arrangement can be realized as shown in FIG. 4 wherein the input B of the exclusive OR gate EXOR is driven by a pseudo-noise generator and the interesting fluctuation amplitude is filtered out with the use of a correlator tuned to the pseudo-random bit sequence.

An advantage is related in the above-described methods and test intallations by superimposing a secondary electron topography signal or some other topography signal on the output signal for two-dimensional imaging of the specimen IC under test. This facilitates localization of the imaged regions on a specimen surface which carry the sought-after signal or bit pattern.

Of course, the secondary electron signal measured at each point on the specimen IC need not arise exclusively by means of voltage contrast. Any other contrast mechanism which influences the secondary electrons as a result of signals at a measuring point are suitable for this purpose. For example, in magnetic bubble memories, the secondary electrons SE are deflected by local magnetic fields (magnetic contrast). Furthermore, the invention is not limited to the use of electrons as primary and secondary particles. Depending on the application, ions or other particles can come into consideration as primary or secondary particles instead of electrons. Of course, lasers can also be used for generating a primary beam.

(*) In all arrangements described here it is, of course, possible to replace the phase-sensitive detector (such as a lock-in amplifier) by a band-pass filter and a succeeding demodulator and vice versa.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A method for identifying points having a defined time dependent signal on a specimen, comprising:
    focusing a primary beam of a scanning microscope onto at least one point of a specimen having a first time-dependent signal, said primary beam generating a secondary particle beam emanating from said at least one point of the specimen;
    registering secondary particles in said secondary particle beam;
    generating a secondary electrical signal from the registering secondary particles;
    selecting one of said primary beam and said secondary particle beam and said secondary electrical signal;
    alternately modulating said selected one with a second time dependent signal which is defined as sought-after signal and a negation of said second time dependent signal;
    integrating the secondary electrical signal to produce a measured signal; and
    deriving from the measured signal the degree of coincidence of the first time-dependent signal and said second time-dependent signal.

2. A method as claimed in claim 1, wherein said second time dependent signal of the step of alternately modulating is at a first frequency, and further comprising:
    filtering a first signal component having the first frequency from the measured signal.

3. A method as claimed in claim 2, further comprising:
    comparing an amplitude of the first signal component to a variable threshold to produce an evaluation signal.

4. A method as claimed in claim 3, further comprising:
    superimposing a topography signal on the evaluation signal to generate a superimposed signal; and
    recording the superimposed signal.

5. A method as claimed in claim 4, further comprising:
    recording the evaluation signal.

6. A method as claimed in claim 2, further comprising:
    recording the first signal component.

7. A method as claimed in claim 1, further comprising:
    shifting said negation of said second time dependent signal and said second time dependent signal relative to the first time-dependent signal by a predetermined phase.

8. A method as claimed in claim 7, further comprising:
periodically modifying the predetermined phase by which said negation of said second time dependent signal and said second time dependent signal are shifted relative to the first time-dependent signal by a second frequency;
filtering a first signal component having a first frequency out of the measured signal; and
filtering a second signal component having the second frequency out of the first signal component.

9. A method as claimed in claim 8, further comprising:
comparing an amplitude of the second signal component to a variable threshold to produce an evaluation signal.

10. A method as claimed in claim 9, further comprising:
recording the evaluation signal.

11. A method as claimed in claim 9, further comprising:
superimposing a topography signal on the evaluation signal to generate a superimposed signal; and
recording the superimposed signal.

12. A method as claimed in claim 8, further comprising:
recording the second signal component.

13. A method as claimed in claim 1, further comprising:
controlling a signal change of the alternately modulating step by a digital bit sequence; and
filtering a signal component corresponding to the digital bit sequence out of the measured signal.

14. A method as claimed in claim 1, further comprising:
modulating an intensity of the primary beam by said second time dependent signal and
said negation of said second time dependent signal.

15. A method as claimed in claim 1, further comprising:
modulating a flow of the secondary particles by said second time dependent signal and
said negation of said second time dependent signal.

16. A method as claimed in claim 1, further comprising:
modulating the secondary electrical signal by said second time dependent and said negation of said second time dependent signal.

17. A method as claimed in claim 1, further comprising:
scanning at least a sub-region of the specimen with the primary beam.

18. A method as claimed in claim 1, further comprising:
recording a topography signal at each one of the points of the specimen scanned by the primary beam.

19. An apparatus for identifying points on a specimen having a defined time-dependent signal, the apparatus including a scanning microscope having a primary beam generator and means for deflecting and focusing the primary beam, said primary beam generating a secondary particle beam, a drive for supplying signals to the specimen, means for registering secondary particles in said secondary particle beam and means for generating a secondary electrical signal from the registered secondary particles, comprising:
means for modulating a selected one of said primary beam and said secondary particle beam and said secondary electrical signal;
means for driving said modulating means;
means for negating a signal appearing between said driving means and said modulating means;
means for switching said negating means between a negating and a non-negating operating mode; and
a first signal generator connected to said switching means.

20. An apparatus as claimed in claim 19, further comprising:
an integrator connected at an output of said secondary electrical signal generating means; and
first means for demodulating an output of said integrator.

21. An apparatus as claimed in claim 20, further comprising:
a second signal generator;
a time-delay element connected for control by said second signal generator and having an output connected to said driving means so that sought after time dependent signal and the negated signal are supplied to said modulating means phase-shifted relative to a signal from said first signal generator;
said second signal generator producing a second frequency to periodically modify a phase-shift of said time-delay element; and
a second means for demodulating connected to demodulate a signal having said second frequency.

22. An apparatus as claimed in claim 20, wherein said first demodulating means is a phase-sensitive detector.

23. An apparatus as claimed in claim 20, wherein said first demodulating means includes a band-pass filter tuned to one of
a first frequency and a second frequency, and an amplitude demodulator connected at an output of said band-pass filter.

24. An apparatus as claimed in claim 20, wherein said first demodulating means includes a correlator.

25. An apparatus as claimed in claim 17, further comprising:
a bit sequence generator having an output connected to said negating means;
an integrator connected to an output of said secondary electrical signal generating means; and
a means for demodulating an output of said integrator, said demodulating means supplied with a signal from said bit sequence generator.

26. An apparatus as claimed in claim 25, further comprising:
a mixer connected between said secondary electrical signal generating means and said integrator, said mixer having a second input connected to an output of said negating means.

27. An apparatus as claimed in claim 19, further comprising:
a beam modulation system for modulating said primary beam.

28. An apparatus as claimed in claim 19, further comprising:
a spectrometer for modulating the current of the secondary particles.

29. An apparatus as claimed in claim 17, further comprising:

said means for registering secondary particles including an extraction grid; and a detector connected to the extraction grid to vary the voltage of the extraction grid.

30. An apparatus as claimed in claim 19, further comprising:
means for registering an output signal of said apparatus and for registering a topography signal under predetermined conditions.

* * * * *